United States Patent
Pethe et al.

(10) Patent No.: US 9,646,850 B2
(45) Date of Patent: May 9, 2017

(54) HIGH-PRESSURE ANNEAL

(71) Applicant: GLOBALFOUNDRIES Inc., Grand Cayman (KY)

(72) Inventors: Wieland Pethe, Dresden (DE); Dirk Noack, Lauchhammer (DE); Bernd Kallauch, Malschwitz (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/791,784

(22) Filed: Jul. 6, 2015

(65) Prior Publication Data
US 2017/0011932 A1   Jan. 12, 2017

(51) Int. Cl.
| | | |
|---|---|---|
| H01L 21/336 | (2006.01) | |
| H01L 23/48 | (2006.01) | |
| H01L 21/324 | (2006.01) | |
| H01L 21/28 | (2006.01) | |
| H01L 29/66 | (2006.01) | |
| H01L 21/67 | (2006.01) | |
| F27B 17/00 | (2006.01) | |

(52) U.S. Cl.
CPC ........ *H01L 21/324* (2013.01); *F27B 17/0025* (2013.01); *H01L 21/28185* (2013.01); *H01L 21/67098* (2013.01); *H01L 29/66568* (2013.01)

(58) Field of Classification Search
CPC ............. H01L 21/8238; H01L 27/0922; H01L 27/11807; H01L 2027/11807; H01L 21/76897; H01L 21/8224; H01L 21/8228; H01L 21/8234; H01L 21/823885; H01L 29/0847; H01L 29/43216; H01L 29/42384; H01L 29/66
USPC ..... 438/653, 3, 299, 680, 478, 795, 305, 77, 438/557, 151, 648, 457; 257/751, 347, 257/755
See application file for complete search history.

(56) References Cited

U.S. PATENT DOCUMENTS

| | | | | |
|---|---|---|---|---|
| 5,984,642 A | * | 11/1999 | Danielsson | ............... F15B 3/00 417/264 |
| 6,143,632 A | * | 11/2000 | Ishida | ............... H01L 21/26506 257/607 |
| 6,176,930 B1 | * | 1/2001 | Koai | ................... C23C 16/4486 118/715 |
| 2007/0187386 A1 | * | 8/2007 | Kim | ...................... H01L 21/324 219/385 |
| 2010/0075449 A1 | * | 3/2010 | Hwang | ............. H01L 21/02532 438/30 |
| 2011/0135557 A1 | * | 6/2011 | Rangarajan | ............. C23C 16/30 423/345 |
| 2011/0215090 A1 | * | 9/2011 | Shimizu | ................. C21D 1/773 219/651 |

(Continued)

*Primary Examiner* — Julio J Maldonado
*Assistant Examiner* — Moin Rahman
(74) *Attorney, Agent, or Firm* — Amerson Law Firm, PLLC

(57) ABSTRACT

A method of treating a semiconductor device is provided including the steps of loading the semiconductor device in a processing chamber, pressurizing the processing chamber by supplying a processing gas from a pressure chamber to the processing chamber, performing a thermal anneal of the semiconductor device in the processing chamber, and depressurizing the processing chamber by supplying the processing gas from the processing chamber to the pressure chamber.

20 Claims, 2 Drawing Sheets

(56) References Cited

U.S. PATENT DOCUMENTS

| | | | | |
|---|---|---|---|---|
| 2011/0287620 A1* | 11/2011 | Xu | ................... | H01L 21/02181 |
| | | | | 438/591 |
| 2013/0099328 A1* | 4/2013 | Xu | ......................... | H01L 29/51 |
| | | | | 257/411 |
| 2013/0157460 A1* | 6/2013 | Fu | .................... | H01L 21/28052 |
| | | | | 438/660 |

* cited by examiner

HIGH-PRESSURE ANNEAL

BACKGROUND OF THE INVENTION

1. Field of the Invention

Generally, the present disclosure relates to the field of manufacturing of integrated circuits and semiconductor devices, and, more particularly, to anneal treatment of semiconductor devices.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. Miniaturization and increase of circuit densities represent ongoing demands.

During the semiconductor manufacturing process, various different anneal treatments are performed on a semiconductor wafer, for example, during or following oxidation, nitridation, silicidation, ion implants, chemical vapor deposition processes, etc., to achieve effective reaction with the interface as well as the bulk of the semiconductor wafer. A hydrogen or deuterium passivation process is also a known practice performed at elevated temperatures, typically at around 400-500° C. Degradation of operating performance of semiconductor devices (for example, CMOS transistor device structures) due to hot carrier effects attributed to hydrogen desorption at an oxide (typically silicon oxide)/semiconductor (typically silicon) interface has been recognized for many years. It has been proposed to subject such devices to hydrogen ($H_2$) or deuterium annealing at a convenient stage of the device forming process, before or subsequent to the formation of contacts and interconnects.

Field effect transistors (FETs) represent semiconductor devices of particular importance. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed between the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. In general, a manufacturing process that uses silica ($SiO_2$) as gate dielectrics of MOSFETs includes metallization followed by an anneal step at about 400-450° C. Anneal processes are, however, also of importance in the manufacturing of high-k/metal gate transistors.

In principle, there are two well-known processing methods for forming a planar or 3D transistor with a high-k/metal gate (HK/MG) structure: (1) the so-called "gate last" or "replacement gate" technique; and (2) the so-called "gate first" technique. In general, using the "gate first" technique involves forming a stack of layers of material across the substrate, wherein the stack of materials includes a high-k gate insulation layer, one or more metal layers, a layer of polysilicon and a protective cap layer, for example, silicon nitride. Thereafter, one or more etching processes are performed to pattern the stack of materials to thereby define the basic gate structures for the transistor devices. In the replacement gate technique, a so-called "dummy" or sacrificial gate structure is initially formed and remains in place as many process operations are performed to form the device, for example, the formation of doped source/drain regions, performing an anneal process to repair damage to the substrate caused by the ion implantation processes and to activate the implanted dopant materials. At some stage of the process flow, the sacrificial gate structure is removed to define a gate cavity where the final HK/MG gate structure for the device is formed. Particularly, hydrogen and/or deuterium anneal of high-k gate dielectric FETs showed significant performance improvement in charge reduction, dangling bond reduction and increase of transconductance.

In all of the above-mentioned anneal processes, key determining factors for effective reaction include the process temperature, processing time and the concentration of a particular gas or a mixture of gases used for a particular anneal treatment. By increasing the pressure of the process gas, it is possible to reduce both the processing temperature and the process time. By increasing the gas concentration at the same temperature, the process efficiency may be improved. It should be noted that exposure of semiconductor wafers, or more precisely integrated circuits, to excessive heat generally degrades the quality of the integrated circuits, in an irreversible and cumulative way. This is partly caused by the diffusion of various carriers and ions implanted on the wafer. The diffusion rates do increase with temperature. As the technology and device structures approach the nanometer scale, the limited thermal budget requirement demands higher concentration of the processing gas and/or lower treatment temperature. In fact, hydrogen or deuterium high-pressure anneal (at pressures up to some 20 atm, for example) has been proven to provide excellent performance improvement of semiconductor devices.

However, during the high-pressure anneal, large amounts of the processing gas, for example, deuterium, are needed. The need for the processing gas not only significantly increases the overall manufacturing costs but also the processing gases typically are highly reactive, inflammable, toxic or otherwise dangerous, and when these gases are pressurized, the likelihood of leakage of the gas from the pressure vessel or its support subsystems to the atmosphere increases. Hydrogen/deuterium gas, for example, is highly inflammable, and when high concentrations of hydrogen/deuterium are exposed to oxygen in the atmosphere, it can explode.

In view of the situation described above, the present disclosure provides techniques that allow for the high-pressure anneal of semiconductor devices with a significantly reduced amount of processing gas needed as compared to the art.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to anneal treatment of semiconductor devices, for example, transistor devices, and more particularly MOSFETs. Particularly, the described high-pressure anneal may be employed in the context of the manufacture of HK/MG FETs (high-k metal gate field effect transistors).

A method of treating a semiconductor device is provided including the steps of loading the semiconductor device (or a semiconductor wafer) in a processing chamber, pressurizing the processing chamber by supplying a (pressurized) processing gas (for example, comprising or consisting of deuterium) from a pressure chamber to the processing chamber, performing a thermal anneal of the semiconductor device in the pressurized processing chamber in the presence of the processing gas and depressurizing the processing chamber by supplying the processing gas from the processing chamber to the pressure chamber after completion of the anneal. The anneal may be performed at a temperature in the range of 150-600° C. at a pressure at least 5 atm (1 atm=101325 Pa). Contrary to the art, after the anneal process, most of the processing gas is not exhausted and wasted, but supplied to the pressure chamber for re-use in a future anneal process. Some processing gas may be used to purge the small volume of the processing chamber in the beginning of the overall processing.

Moreover, a method of manufacturing a semiconductor device comprising a high-k metal gate transistor device is provided including the steps of forming a high-k dielectric layer on a semiconductor layer, forming a metal-containing layer of material on the high-k dielectric layer, and performing an anneal treatment of the semiconductor device including the steps of loading the semiconductor device in a processing chamber, pressurizing the processing chamber by supplying a (pressurized) processing gas from a pressure chamber to the processing chamber, and performing a thermal anneal of the semiconductor device in the pressurized processing chamber in the presence of the processing gas. Subsequently, the processing chamber is depressurized by supplying the processing gas from the processing chamber to the pressure chamber after completion of the thermal anneal. Passivation and reduction of hot carrier effects may be reduced by the thermal anneal. Again, the processing gas may be re-used in a future anneal process.

Moreover, a method of treating a semiconductor device including a semiconductor layer and an insulating layer formed on a surface of the semiconductor layer is provided including the steps of loading the semiconductor device in a processing chamber, pressurizing the processing chamber by supplying a (pressurized) processing gas comprising deuterium from a pressure chamber to the processing chamber such that the pressurized process chamber has a pressure of at least 5 atm, performing a thermal anneal of the semiconductor device in the pressurized processing chamber to form a concentration of deuterium of the deuterium processing gas at the interface of the semiconductor layer and the insulating layer, and depressurizing the processing chamber by supplying the processing gas from the processing chamber to the pressure chamber after completion of the thermal anneal. By formation of the concentration of deuterium at the interface of the semiconductor layer and the insulating layer, degradation of the semiconductor device due to hot carrier effects is reduced.

Furthermore, an apparatus for performing a high-pressure anneal of a semiconductor device is provided including a processing chamber, a pressure chamber, a conduction line connecting the processing chamber and the pressure chamber, and a control unit (for example, comprising a computational device, a CPU and/or a microcontroller). The control unit being configured to control the pressurization of the processing chamber by supply of a pressurized processing gas from the pressure chamber to the processing chamber, the thermal anneal of the semiconductor device in the pressurized processing chamber and the depressurization of the processing chamber by supply of the processing gas from the processing chamber to the pressure chamber.

BRIEF DESCRIPTION OF THE DRAWINGS

The disclosure may be understood by reference to the following description taken in conjunction with the accompanying drawings, in which like reference numerals identify like elements, and in which.

Figure 1A:
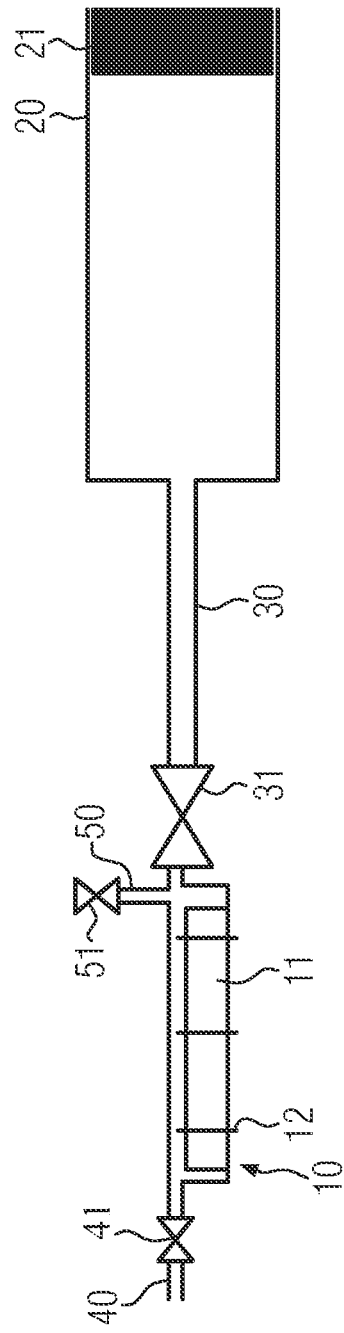
FIGS. 1a-1g illustrate an apparatus for high-pressure thermal anneal and operation of the same according to an example of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the present disclosure. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached FIGURES. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As will be readily apparent to those skilled in the art upon a complete reading of the present application, the presented techniques are applicable to a variety of technologies, for example, NMOS, PMOS, CMOS, etc., and is readily applicable to a variety of devices, including, but not limited to, logic devices, memory devices, etc. Generally, manufacturing techniques and semiconductor devices in which N-channel transistors and/or P-channel transistors are formed are described herein. The techniques and technologies described herein may be utilized to fabricate MOS integrated circuit devices, including NMOS integrated circuit devices, PMOS integrated circuit devices and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate.

The present disclosure provides high-pressure anneal of semiconductor devices wherein the processing gas is not exhausted and wasted after the anneal process but rather supplied back to a pressure chamber wherein it is stored until it is re-used in a subsequent anneal process. In particular, the anneal process may be performed in the context of the manufacture of HK/MG transistor devices.

An apparatus according to an example of the present disclosure and operation of the same is illustrated in FIGS. 1a-1g. The apparatus comprises a processing chamber 10 and a pressure chamber (tank) 20. The volume of the pressure chamber 20 is much larger than the one of the processing chamber 10. For example, the volume of the pressure chamber 20 may be 25-200 liters and the one of the processing chamber 10 may be 1-8 liters.

Both chambers 10 and 20 may be substantially made of stainless steel. The pressure chamber 20 comprises a pressurization means 21 and stores a processing gas used for an anneal process to be carried out in the processing chamber. The stored processing gas may comprise or consist of deuterium. In particular, the processing gas may consist of a mixture of deuterium and $H_2$. In a standby stage (FIG. 1a), the pressure chamber 20 may store the processing gas at atmospheric pressure. The pressure chamber 20 and the processing chamber 10 are connected to each other by a conduction line 30 comprising a two-way valve 31.

The processing chamber 10 comprises a heating means 11 and lift pins 12 for supporting a semiconductor device to be treated in the processing chamber 10. The heating means 11 may comprise a main vessel, a heater and a reactor cover. The processing chamber 10 may comprise a cover sealed with an O-ring, for example. Any supply and exhaust lines provided may extend through the cover. A pressure sensor and a temperature sensor (not shown) connected to a pressure and temperature control may be provided within the processing chamber 10. The pressure sensor and a temperature sensor monitor the pressure and temperature in the processing chamber 10.

A purge line 40 with a purge valve 41 and an exhaust line 50 with an exhaust valve 51 are connected to the processing chamber 10. In a standby stage (FIG. 1a), all valves 31, 41 and 51 are closed and the lift pins 12 are in an up-position with no wafer present in the processing chamber 10.

Figure 1B:
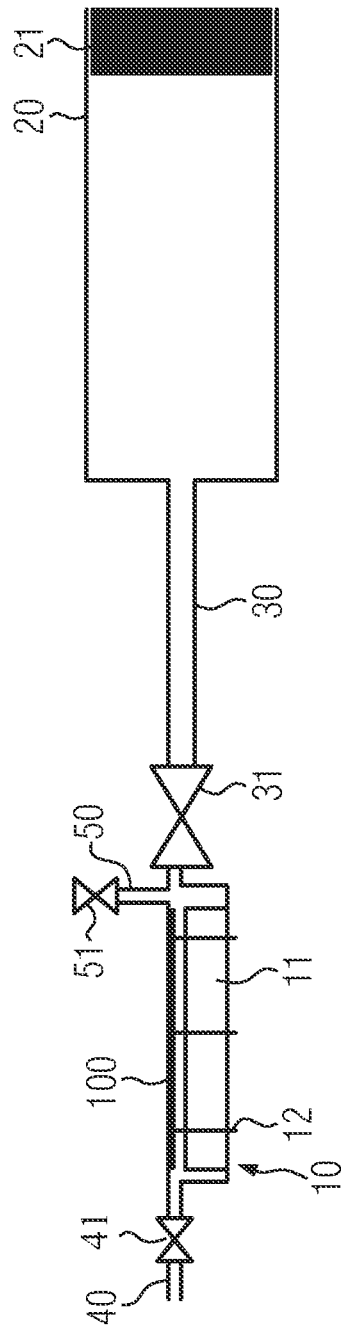
Figure 1C:
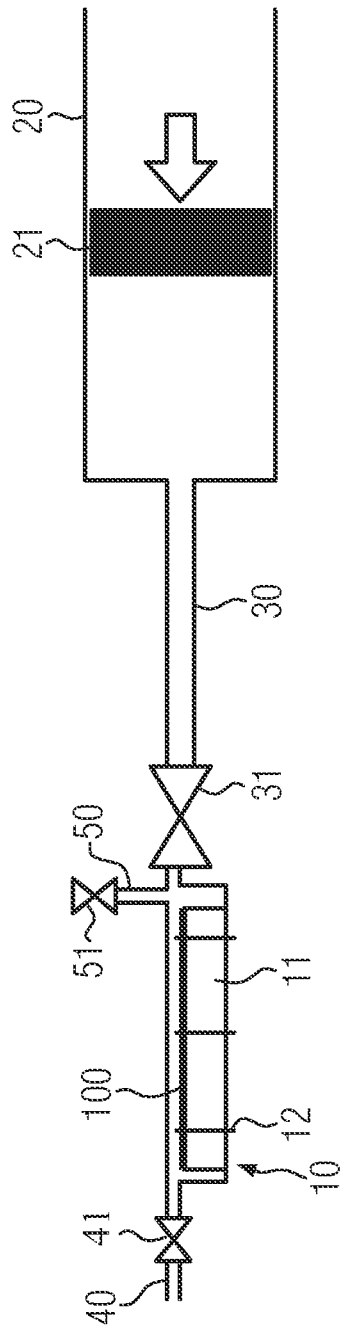

In the operation stage shown in FIG. 1b, the processing chamber 10 is purged and a wafer 100 is loaded in the processing chamber 10. The wafer 100 is supported by the lift pins 12 in the up-position. A great variety of semiconductor devices including FETs, particularly HK/MG transistor devices, may be formed on the wafer 100. The wafer 100 may comprise a substrate that may be a semiconductor substrate. The semiconductor substrate may comprise a semiconductor layer, which in turn may be comprised of any appropriate semiconductor material, such as silicon, silicon/germanium, silicon/carbon, other II-VI or III-V semiconductor compounds and the like. The semiconductor substrate may comprise a silicon-based material containing other iso-electronic components, such as germanium, carbon and the like. The semiconductor substrate may be a silicon substrate, in particular a single crystal silicon substrate. Other materials may be used to form the semiconductor substrate such as, for example, germanium, silicon germanium, gallium phosphate, gallium arsenide, etc. Furthermore, the substrate may define a silicon-on-insulator (SOI) configuration. In this case, the substrate comprises a semiconductor bulk substrate, for example, a bulk silicon substrate, a buried oxide layer formed on the semiconductor bulk substrate and a thin semiconductor layer, for example, a semiconductor layer comprising silicon, formed on the buried oxide layer.

Purging is performed by supplying a purge gas through purge line 40 and opened purge valve 41 and exhausting gas through exhaust line 50 and opened exhaust valve 51. The purge gas may comprise deuterium and may be supplied by a purge gas source different from the pressure chamber 20 or it may be supplied by the pressure chamber 20. However, in this example at this stage of operation, stage valve 31 of the conduction line 30 connecting the processing chamber 10 and the pressure chamber 20 maintains closed.

In order to initiate an anneal treatment of the wafer 100, the heating means 11 is operated to heat up the interior of the processing chamber 10 and the wafer 100 (the lift pins 12 are in a down-position) and the processing gas stored in the pressure chamber 20 is pressurized by the pressurization means 21. Operation of the pressurization means 21 during the pressurization process significantly reduces the volume occupied by the processing gas in the pressure chamber 20. In this stage (FIG. 1c), the purge valve 41 and the exhaust valve 51 are closed. Pressurization of the processing chamber 10 is performed by pressurization of the processing gas in the pressure chamber 20 by the pressurization means 21 of the same and supply of the pressurized processing gas from the pressure chamber 20 to the processing chamber 10 through the conduction line 31 and the opened valve 31. It is noted that provision of the pressurization means 21 allows for accurate adjustment of the pressure of the processing gas in the pressurized processing chamber 10.

Figure 1D:
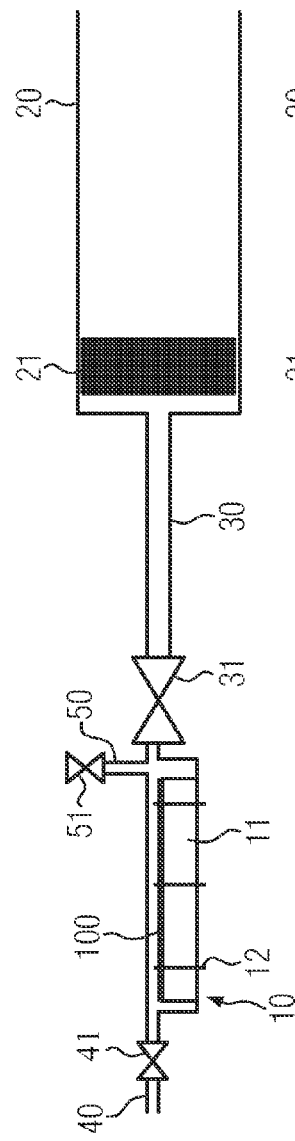

Pressurization of the processing chamber 10 up to a pressure of more than 5, 10, 15 or 20 atm may be considered suitable depending on the actual anneal treatment. During the anneal treatment, that might be performed for some seconds up to half an hour at a temperature of 150-600° C., for example, all valves 31, 41 and 51 are closed and the lift pins 12 supporting the wafer 100 to be treated are in a down-position (FIG. 1d). It should be noted that, due to the small volume of the processing chamber 10 as compared to the pressure chamber 20 and due to the high-pressure of the processing gas in the processing chamber 10, anneal times, as well as ramp down times, may be significantly reduced as compared to the art. Thereby, for example, hillock formation of metal lines that pose a problem in conventional back end of line (BEOL) processing may be avoided or at least reduced.

Figure 1E:
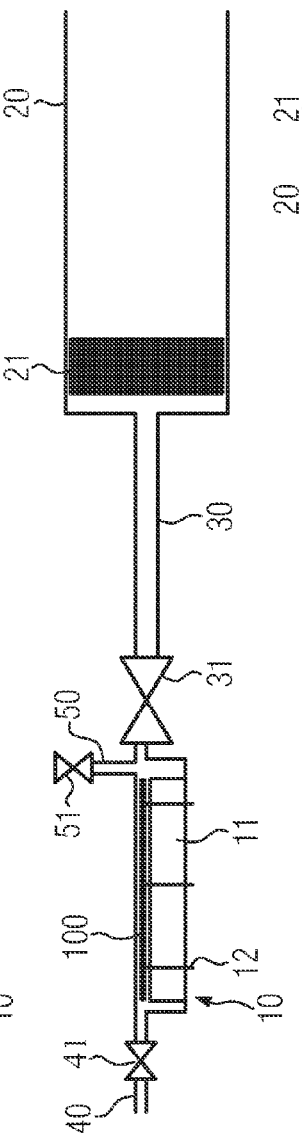
Figure 1F:
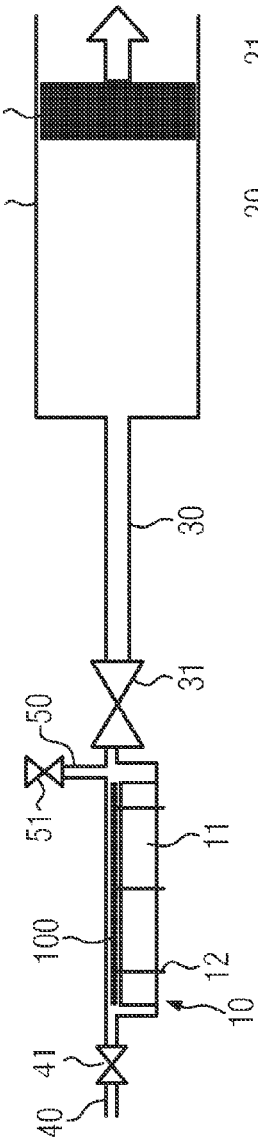
Figure 1G:
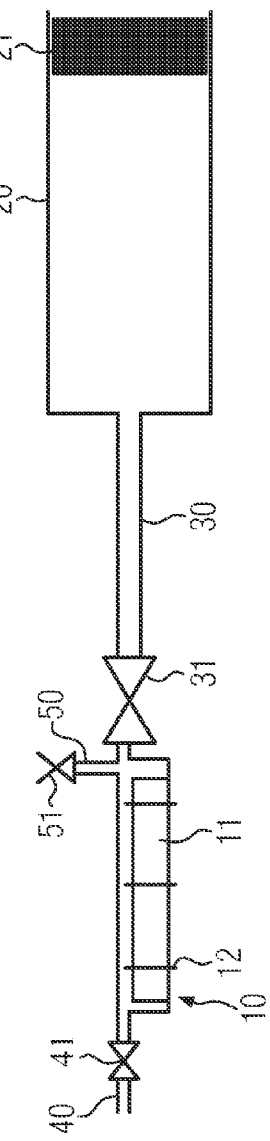

After completion of the anneal treatment, a cooling stage with all valves 31, 41 and 51 closed and the lift pins 12 supporting the wafer 100 in the up-position is reached (FIG. 1e). After completion of the cool down phase, depressurization of the processing chamber 10 is performed. Contrary to the art, depressurization of the processing chamber 10 is not achieved by opening the exhaust valve 51 and exhausting, and thereby wasting, the processing gas to the atmosphere, but rather the exhaust valve 51 is kept close and the valve 31 of the conduction line 30 connecting the processing chamber 10 and the pressure chamber 20 is opened (FIG. 1f). Thus, during depressurization of the processing chamber 10, the processing gas is supplied from the processing chamber 10 back to the pressure chamber 20 via the conduction line 30 and opened valve 31. After completion of the depressurization of the processing chamber 10, the valve 31 of the conduction line 30 is closed and the wafer 100 is unloaded (FIG. 1g). Before unloading of the wafer 100, the processing chamber 10 may be purged, for example, with $N_2$.

The wafer or semiconductor device treated in the processing chamber 10 as described above may comprise an HK/MG device. The anneal treatment illustrated by means of FIGS. 1a-1g may be performed at any suitable point during the overall manufacturing of the HK/MG device. For example, it may be performed after formation of a high-k dielectric layer on a semiconductor layer or after metallization of the high-k dielectric layer, i.e., after forming a metal-containing layer of material on the high-k dielectric layer such as a metal-containing work-function adjusting layer of material. In principle, the anneal treatment may be performed within the gate first or replacement gate techniques described above. The gate dielectric layer may include a high-k material having a greater dielectric constant than $SiO_2$, for example, Hf. The gate dielectric layer may comprise hafnium oxide, hafnium silicon oxide, zirconium oxide, aluminum oxide and the like. The high-k dielectric material layer may have a thickness of one to several nanometers and may be formed by oxidation and/or deposition, depending on the materials required. The manufacturing of the HK/MG device may comprise forming a gate electrode layer on or over the dielectric material layer, for example, by metallization.

The gate electrode layer may comprise a metal gate. The material of the metal gate may depend on whether the transistor device to be formed is a P-channel transistor or an N-channel transistor. In embodiments wherein the transistor device is an N-channel transistor, the metal may include La, LaN or TiN. In embodiments wherein the transistor device is a P-channel transistor, the metal may include Al, AlN or TiN. The metal gate may include a work function adjusting material, for example, TiN. In particular, the metal may comprise a work function adjusting material that comprises an appropriate transition metal nitride, for example, those from Groups 4-6 in the Periodic Table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN), and the like with a thickness of about 1-60 nm. Moreover, the effective work function of the metal gate may be adjusted by added impurities, for example, Al, C or F. Moreover, the gate electrode layer may comprise a polysilicon gate at the top of the metal gate. A cap layer may be formed atop of the gate electrode. Sidewall spacers may be formed at sidewalls of the gate electrode.

The manufacturing of the HK/MG device may comprise forming source and drain regions. The source and drain regions may receive a metal silicide, such as nickel silicide, nickel platinum silicide and the like, thereby reducing the overall series resistance of the conductive path between the drain and source terminals and the intermediate channel regions of the eventually completely formed transistor devices. Moreover, an interlayer dielectric (ILD), for example, made of silicon oxide, silicon nitride or silicon oxynitride, may be formed over the structure comprising the gate electrode and the source and drain regions and contacts may be formed in the ILD for electrically contacting the gate electrode as well as the source and drain regions. The above-described anneal process may be performed after formation of the contacts. In particular, the above-described anneal process may be performed during BEOL processing, for example, after metal deposition or between individual metal depositing steps.

As a result, a method and an apparatus is provided for high-pressure anneal in the context of semiconductor manufacturing wherein the processing gas may be used in a plurality of subsequently performed anneal treatments of semiconductor devices, for example, HK/MG transistor devices, in a processing chamber. The processing gas is supplied from a pressure chamber to the processing chamber for the anneal process and, after completion of the anneal process, the processing gas is supplied to the pressure chamber. This sequence of steps may be repeated as often as considered suitable.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A method of treating a semiconductor device, the method comprising:
    loading said semiconductor device in a processing chamber;

pressurizing said processing chamber by supplying a processing gas from a pressure chamber to said processing chamber;

performing a thermal anneal of said semiconductor device in said pressurized processing chamber in the presence of said processing gas; and depressurizing said pressurized processing chamber after performing said thermal anneal by supplying said processing gas from said processing chamber back to said pressure chamber.

2. The method of claim 1, wherein said processing chamber is pressurized up to a pressure of more than one of 5 atm, 10 atm, 15 atm and 20 atm.

3. The method of claim 1, wherein said processing chamber is connected to said pressure chamber via a conduction line including a valve, the method further comprising opening said valve during said pressurizing of said processing chamber, closing said valve during said performing of said thermal anneal and opening said valve during said depressurizing of said pressurized processing chamber.

4. The method of claim 1, further comprising purging said processing chamber before said step of pressurizing of said processing chamber and wherein said purging comprises supplying a purge gas to said processing chamber from a purge gas source different from said pressure chamber.

5. The method of claim 1, further comprising pressurizing said processing gas in said pressure chamber before pressurizing said processing chamber.

6. The method of claim 1, wherein said processing gas comprises deuterium.

7. A method of manufacturing a semiconductor device comprising a high-k metal gate transistor device, the method comprising:

forming a high-k dielectric layer on a semiconductor layer;

forming a metal-containing layer of material on said high-k dielectric layer;

performing an anneal treatment of said semiconductor device, said anneal treatment comprising:

loading said semiconductor device in a processing chamber; pressurizing said processing chamber by supplying a processing gas from a pressure chamber to said processing chamber; performing a thermal anneal of said semiconductor device in said pressurized processing chamber in the presence of said processing gas;

and depressurizing said pressurized processing chamber after performing said thermal anneal by supplying said processing gas from said processing chamber back to said pressure chamber.

8. The method of claim 7, wherein said processing chamber is pressurized to a pressure of at least 5 atm.

9. The method of claim 7, wherein said processing gas comprises deuterium.

10. The method of claim 7, wherein said anneal treatment is performed before forming said metal-containing layer of material on said high-k dielectric layer.

11. The method of claim 7, wherein said anneal treatment is performed after forming said metal-containing layer of material on said high-k dielectric layer.

12. The method of claim 7, further comprising forming source and drain regions at least partly in said semiconductor layer, wherein said thermal anneal of said semiconductor device is performed after said forming said source and drain regions.

13. The method of claim 12, further comprising forming a gate electrode above said high-k dielectric and forming contacts to said source and drain regions and said gate electrode, wherein said thermal anneal of said semiconductor device is performed after forming said contacts.

14. A method of treating a semiconductor device including a semiconductor layer and an insulating layer formed on a surface of said semiconductor layer, the method comprising:

loading said semiconductor device in a processing chamber;

pressurizing said processing chamber by supplying a processing gas comprising deuterium from a pressure chamber to said processing chamber such that said processing chamber has a pressure of at least 5 atm;

performing a thermal anneal of said semiconductor device in said pressurized processing chamber to form a concentration of deuterium of said processing gas comprising deuterium at an interface of said semiconductor layer and said insulating layer; and depressurizing said pressurized processing chamber after performing said thermal anneal by supplying said processing gas comprising deuterium from said processing chamber back to said pressure chamber.

15. An apparatus for performing a high-pressure anneal of a semiconductor device, the apparatus comprising:

a processing chamber;

a pressure chamber;

a conduction line connecting said processing chamber and said pressure chamber; and a control unit configured to control:

pressurization of said processing chamber by supply of a processing gas from said pressure chamber to said processing chamber;

thermal annealing of said semiconductor device in said pressurized processing chamber in the presence of said processing gas; and depressurization of said pressurized processing chamber after performing said thermal anneal by supply of said processing gas from said processing chamber back to said pressure chamber.

16. The apparatus of claim 15, further comprising a heating device installed in said processing chamber.

17. The apparatus of claim 15, further comprising a pressurization means installed in said pressure chamber.

18. The apparatus of claim 15, further comprising a purge line different from said conduction line and wherein said control unit is configured to control purging of said processing chamber by supplying a purge gas to said processing chamber via said purge line.

19. The apparatus of claim 15, further comprising an exhaust line different from said conduction line and wherein said control unit is configured to control exhausting of gas of said processing chamber during purging of said processing chamber.

20. The apparatus of claim 15, wherein a volume of said processing chamber is at most one of ½, ⅓, ¼, 1/10 and 1/20 of a volume of said pressure chamber.

* * * * *